United States Patent [19]
Aguirre

[11] 3,753,143
[45] Aug. 14, 1973

[54] PHASE LOCKED OSCILLATOR FOR INTEGER PULSE RATES

[75] Inventor: Michael C. Aguirre, Oklahoma City, Okla.

[73] Assignee: Honeywell Information Systems, Inc., Waltham, Mass.

[22] Filed: Aug. 5, 1971

[21] Appl. No.: 169,195

[52] U.S. Cl. .................... 331/8, 328/119, 328/155, 330/16, 330/21, 330/31, 331/17, 331/18, 331/19, 331/26, 331/34, 331/113 R, 340/174.1 A

[51] Int. Cl. .................... H03b 3/04

[58] Field of Search .................... 331/8, 18, 25, 26, 331/34, 177 R, 19, 17; 328/74, 119, 155; 340/174.1 A, 174.1 H

[56] References Cited

UNITED STATES PATENTS

| | | | |
|---|---|---|---|
| 3,493,868 | 2/1970 | Hackett, Jr. | 340/174.1 H |
| 3,537,013 | 10/1970 | Feldman | 331/18 X |
| 3,593,167 | 7/1971 | Koulopoulos | 331/25 X |
| 3,624,521 | 11/1971 | Dellicicchi | 340/174.1 H |

*Primary Examiner*—Roy Lake
*Assistant Examiner*—Siegfried H. Grimm
*Attorney*—James A. Pershon et al.

[57] ABSTRACT

A phase locked oscillator for locking to a train of pulse signals where the pulse repetition rates are integer multiples of each other. The input pulse signals are directed to a bandpass circuit, a tuned amplifier, the center frequency of which is selected to be the same as the reference frequency of a phase detector. The output signal of the bandpass circuit is a sinusoidal signal directed to the gated or multiplier phase detector. A square wave voltage controlled oscillator has a portion of its output signal fed back to the phase detector. The output of the phase detector controls the frequency of the voltage controlled oscillator. In the phase locked loop, the square wave voltage controlled oscillator is locked to a reference frequency from the bandpass circuit independent of an integer change in the pulse repetition rate of the input pulse train signals.

11 Claims, 4 Drawing Figures

INVENTOR
MICHAEL C. AGUIRRE
BY
James A. Perahm
ATTORNEY

PHASE LOCKED OSCILLATOR FOR INTEGER PULSE RATES

BACKGROUND OF THE INVENTION

The present invention relates generally to an automatic frequency stabilized oscillator and more particularly to an automatic frequency stabilized oscillator using a phase locking means.

In standard data processing systems, it is common to use transducers to retrieve magnetic pulse information stored on a magnetic disc or magnetic tape. In many of the disc and tape systems, it is also common to obtain a clocking signal from the data pulse train read by the transducer from the magnetic pulses stored on the disc and tapes. The clock signal must be synchronous with the data pulse train. One method of obtaining the clock signal in common use is to use a phase locked oscillator to generate the clock signals. The phase locked oscillator is locked in frequency to the incoming train of data pulses.

Control systems in which the frequency of a variable frequency oscillator is automatically synchronized with reference oscillations are well known in the art especially when the frequency of the reference oscillator or a harmonic thereof is sufficiently close to the oscillator frequency. A phase locked oscillator control system has the output of a phase detector supplied to a variable controlled oscillator through a filter. A portion of the output of the variable controlled oscillator then is supplied back to the phase detector. In many prior art devices of the phase locked oscillator type, the pulses directed to the phase detector comprise a spectrum of frequency. The phase detector compares only the frequency fed back by the variable controlled oscillator and the corresponding harmonic of the input pulses. In such a prior art system the phase detector must be capable of handling the entire tuning range of the variable controlled oscillator.

A more advanced prior art device adds a mixer and a frequency multiplier not necessarily phase locked with any other signal. The input signals are fed through the frequency multiplier to the mixer which also receives the output of the variable controlled oscillator. The output of the mixer is then fed to the phase detector. The frequency multiplier functions to produce a harmonic which is different from the output frequency of the variable controlled oscillator by a difference frequency. The difference frequency is then supplied to the phase detector. Thus a low intermediate frequency is used for comparison in the phase detector. Such a scheme, however, has a disadvantage in that it is necessary to provide a frequency multiplier from which various harmonics can be extracted without undue interference from adjacent harmonics.

In another prior art device, a harmonic bandpass filter is used to pass harmonics of the reference frequency to lock the variable controlled oscillator to a harmonic of the correct frequency. The input pulses are passed through the bandpass filter which passes the harmonic frequencies of the reference throughout the range of selected master oscillator output frequencies. The output of the harmonic bandpass filter is passed as an input to an auxiliary phase discriminator which is also receiving an input directly from the master oscillator. A second or low frequency phase locking loop is also provided to override the high frequency loop capture to progressively drop the master oscillator down to the next multiple of the harmonic frequency. The harmonic bandpass filter is, therefore, only used to provide a harmonic capture frequency for the variable controlled oscillator and a second or low frequency filter must be used to accomplish the actual capture. When the correct selected frequency of the variable controlled oscillator is reached, the harmonic bandpass filter is overridden by the low frequency loop which comprises feeding the input signal to a frequency multiplier and mixing this signal with a feedback signal from the variable controlled oscillator. The disadvantages of the aforementioned system are the possibility of false locking to one of the many harmonics of the bandpass filter and the resultant duplication of circuitry in order to insure that the correct reference frequency is achieved.

SUMMARY OF THE INVENTION

In accordance with the invention claimed, a phase locked oscillator for pulse input signals is provided comprising a bandpass circuit producing a sinusoidal harmonic frequency which serves as a first input to a gated phase detector. A portion of the output signal from the variable controlled oscillator serves as a second input to the phase detector. The phase detector in turn controls the frequency of the oscillator.

The subject invention comprises means to synchronize an output signal of a square wave voltage controlled oscillator with a data pulse train. A train of data pulses, with pulse repetition rates equal to multiple integers of each other, is transmitted through a linear phase bandpass circuit or bandpass filter. The bandpass circuit produces from the pulse train a sinusoidal, harmonically related signal which serves as a first input to a gated phase detector. A portion of the output signal from the voltage controlled oscillator serves as a second input to the phase detector. The frequency of the variable controlled oscillator is controlled by the output from the phase detector. Thus, by the operation of the phase locked loop, the square wave voltage controlled oscillator is locked to a reference frequency even though the pulse repetition rate of the synchronizing signal changes by integer multiples.

It is, therefore, an object of the present invention to provide an enhanced phase locked oscillator.

It is another object of the present invention to provide a phase locked oscillator that locks to a train of pulse signals where the pulse repetition rates are integer multiples of each other.

Yet another object of the present invention is to provide a phase locked oscillator that uses a bandpass circuit.

Still another object is to provide a phase locked oscillator which has a square wave voltage controlled oscillator controlled by a phase detector which compares the oscillator output with an output from a bandpass circuit to lock the oscillator to the frequency of pulse signals directed to the bandpass circuit.

These and other objects will become realized according to a preferred embodiment as the description proceeds and the features of the novelty which characterize the invention will be pointed out in particularity in the claims forming a part of this specification.

BRIEF DESCRIPTION OF THE DRAWINGS

Further features and a more specific description of an illustrated embodiment of the invention are presented hereinafter with reference to the accompanying drawings, wherein.

DESCRIPTION OF THE PREFERRED EMBODIMENT

Figure 1:
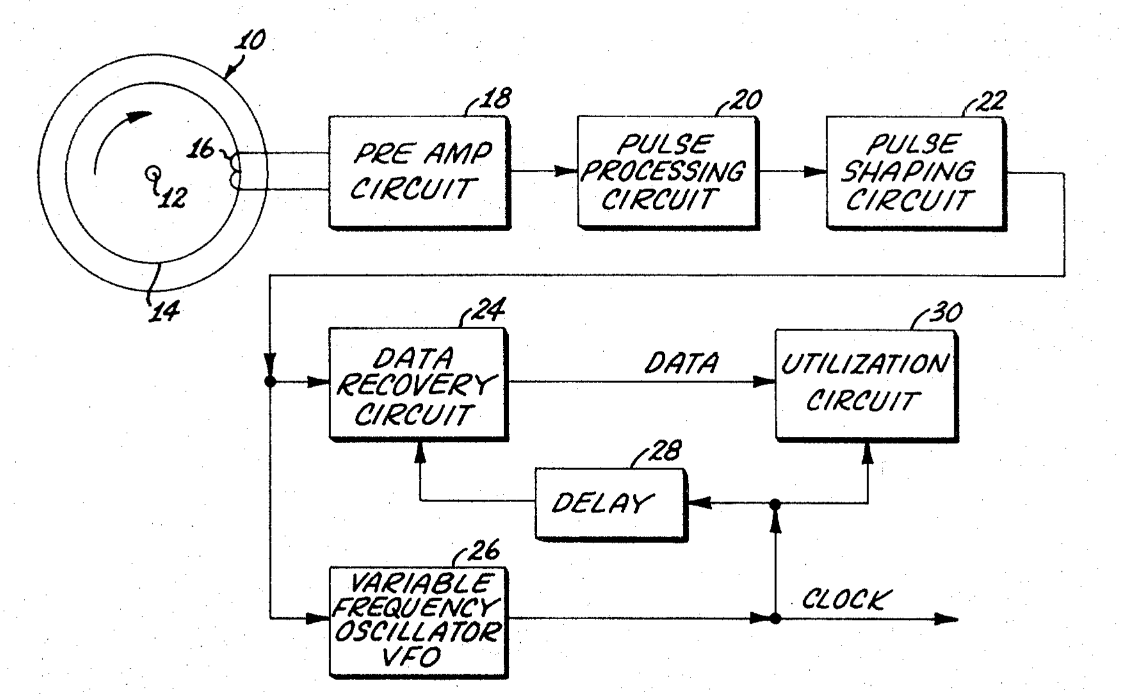
FIG. 1 is a block diagram of a magnetic disc subsystem which includes a controlled variable frequency oscillator according to the present invention.

The present invention is disclosed in FIG. 1 for use in recovering data from a storage medium in the form of a disc 10 having a magnetizable coating. The application of the phase locked oscillator according to the present invention to the disc reading system as shown in FIG. 1, should not be taken to limit the present invention to only that of a disc reading system. It is obvious that the phase locked oscillator of the present invention may be used in any system which requires a variable harmonic frequency stabilized oscillator requiring phase locking according to integer pulse rates.

In FIG. 1 the disc storage medium 10 is mounted for rotation about an axis 12 by a suitable drive means, not shown. An information track 14 arranged on the storage medium 10 is provided for storing intelligence in the form of discrete magnetically polarized areas. A suitable transducer 16 is arranged adjacent to the information track 14 and serves to generate electrical signals in response to relative motion between the storage medium 10 and the transducer 16 in response to the changing polarity of discrete areas on the track 14. The signals thus generated contain the data and timing information which is utilized by a data processing system to manipulate information as required.

Figure 4:
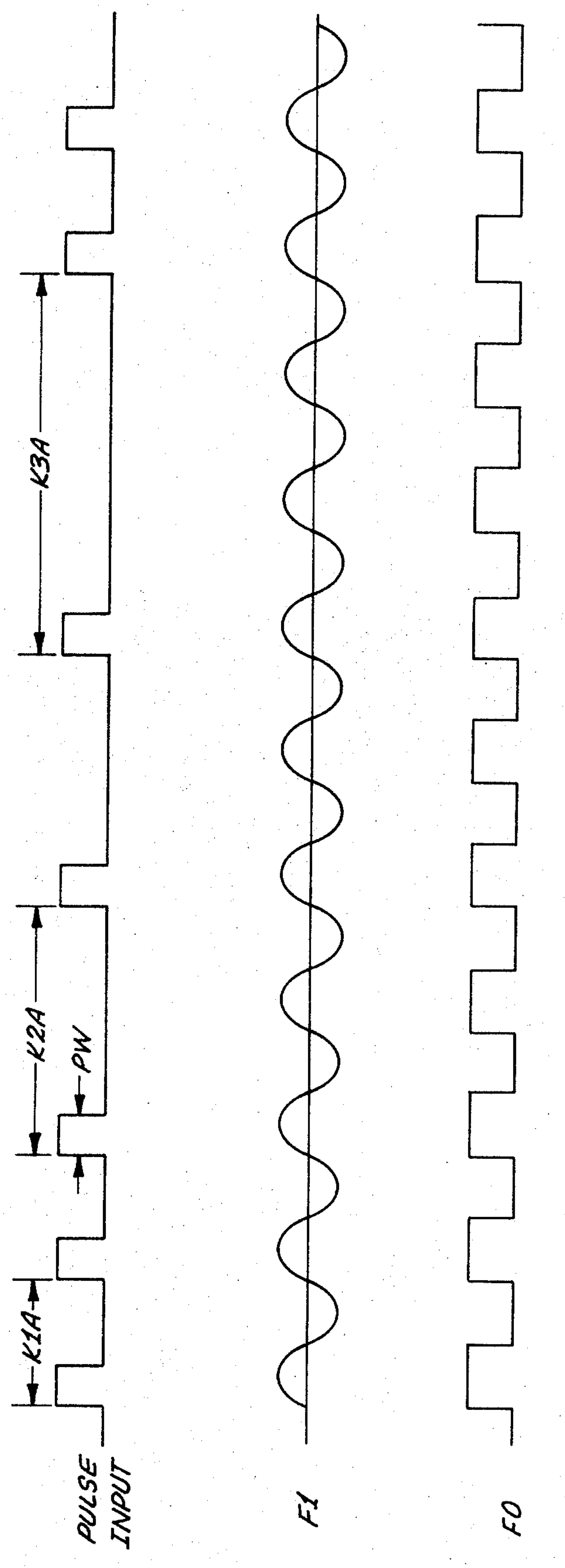
FIG. 4 is a timing diagram of selected signals.

The signals from the transducer 16 are directed to a preamplifier circuit 18 where they are amplified to a power amplitude necessary for use. The amplified signals are then transmitted from the preamp circuit 18 to a pulse processing circuit 20 and from the pulse processing circuit to a pulse shaping circuit 22. The pulse processing circuit 20 and the pulse shaping circuit 22 perform a series of cascaded operations. The first operation differentiates the amplified voltage wave-shape from the preamplifier circuit 18 and provides a waveshape having zero amplitude crossings corresponding in time to the peaks of the input signal from the transducer 16. This wave-shape is then amplified, clipped and again differentiated thereby shaping the waveshapes into the positive and negative pulses approximately 180° out of phase with peaks of the signals from the transducer. These signals are then rectified into a series of single polarity pulses which are transmitted from the pulse shaping circuit 22 to a data recovery circuit 24 and a variable frequency oscillator 26. The single polarity pulses are shown in FIG. 4 as the Pulse Input signals.

The frequency oscillator 26 generates a timing or clocking signal designated CLOCK. The CLOCK signals are used to control the timing of the data transferred into a system utilizing the data pulses and, via a delay circuit 28, the CLOCK pulses also control the data recovery circuit 24 to insure that data pulses only are recovered via the data recovery circuit 24 and extraneous pulses outside of the data timing are ignored. A variable frequency oscillator VFO circuit is necessary because the incoming pulses from the disc can vary in frequency depending upon the speed of the disc and other environmental factors which affect the speed of the disc and because the phase relationship between the data and the clock must be accurately controlled.

The output of the data recovery circuit 24 is a group of pulses whose timing determines the information stored on the storage media. This information is designated DATA. The DATA signals are transmitted to a utilization circuit 30 where they are sensed and reformed for use by a data processing system.

Figure 2:
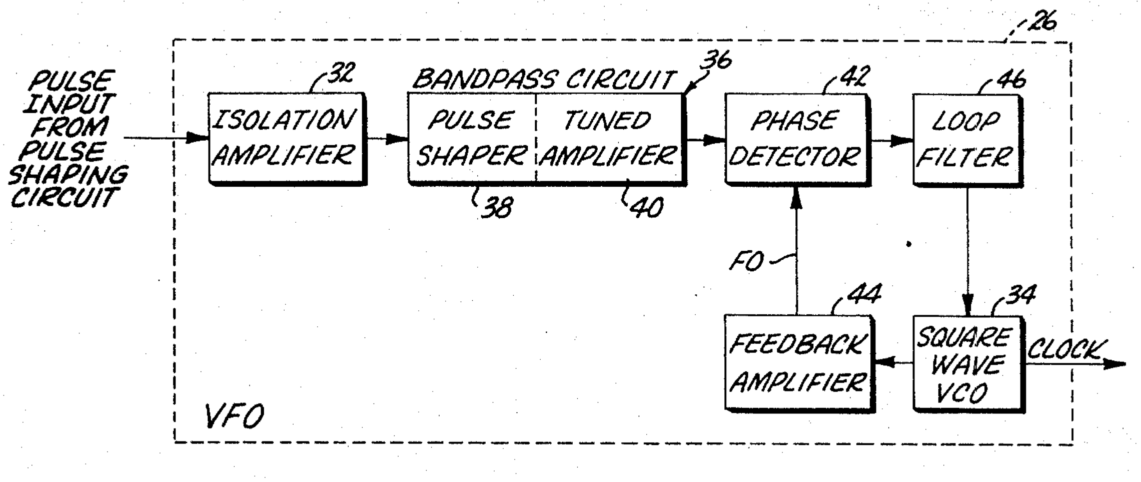
FIG. 2 is a block diagram of the variable frequency oscillator of FIG. 1.
Figure 3:
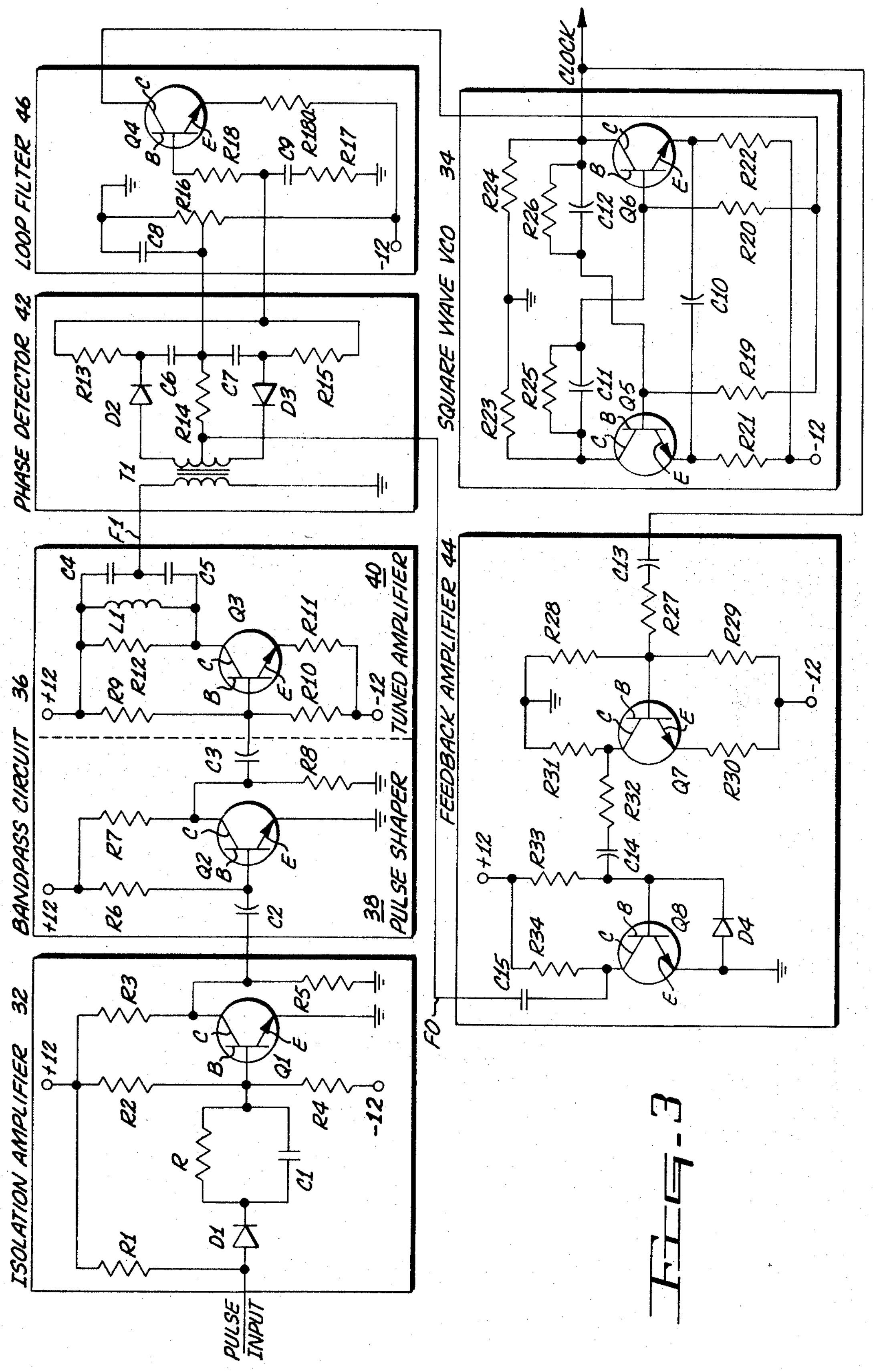
FIG. 3 is a circuit diagram of a variable frequency oscillator according to the block diagram of FIG. 2.

Since the invention presently being discussed lies in the variable frequency oscillator VFO 26 of FIG. 1 and not in the generalized data recovery system shown in FIG. 1, no further circuitry is shown for the preamp circuit 18, the pulse processing circuit 20, the pulse shaping circuit 22 and the data recovery circuit 24. Circuitry for use in the block diagrams of FIG. 1 are standard circuits which are well known in the art. A more detailed block diagram of the variable frequency oscillator of FIG. 1 is shown in FIG. 2. Detailed circuitry for use in the variable frequency oscillator is shown in FIG. 3.

Referring now to FIG. 2, the pulses from the pulse shaping circuit 22 (see FIG. 1) are directed to an isolation amplifier 32 in the variable frequency oscillator 26 shown as VFO. These pulses via the VFO 26 become the timing pulses designated CLOCK. The CLOCK pulses are the output pulses from a square wave voltage controlled oscillator VCO 34 and perform the timing of the rest of the circuits in the system.

The isolation amplifier 32 isolates the operation of the oscillator 26 from the input pulses coming from the pulse shaping circuit 22. the isolation amplifier 32 can be any one of many different types of amplifier circuits, limited only by the frequency of the pulses fed into the isolation circuit. The input pulses are amplified by the isolation amplifier 32 and transmitted to a pulse shaper section 38 of a bandpass circuit 36.

The bandpass circuit 36 is preferably a linear phase type circuit. The linear phase type minimizes phase shift caused by the circuit and maintains a constant time delay in the frequency range of interest. The bandpass circuit 36 includes the pulse shaper 38, which shapes the input pulses from the isolation amplifiers to a uniform pulse width, and a tuned amplifier 40 comprising a resonant circuit which accomplishes the bandpass filtering.

The pulse shaper 38 can be a one-shot multivibrator used to reshape the input signal pulses to a uniform pulse width. This uniform pulse width is not critical, however, there is an optimum pulse width for a particular period T that gives a maximum output signal at the tuned amplifier. This optimum pulse width can be determined by Fourier's analysis as will be discussed in more detail later.

The tuned amplifier 40 according to the preferred embodiment is a parallel resonant circuit tuned to the feedback frequency of the circuit. The tuned amplifier 40 provides a bandpass characteristic used in the filtering. The figure of merit Q of the energy stored in the parallel resonant circuit is adjusted so that the bandwidth and phase characteristics have small amplitude variation and linear phase in the region of the center frequency of the tuned amplifier. This includes any small change in the frequency from the center frequency. This small change in frequency is typically to be designed in the order of plus and minus two percent. If a greater change in frequency from the center frequency is necessary, then the tuned amplifier 40 of the bandpass circuit 36 would more preferably be of the linear phase type instead of the parallel resonant circuit.

The output signal from the tuned amplifier section 40 of the bandpass circuit 36, designated as F1, is a sinusoidal signal having a frequency equal to the fundamental frequency of the pulse train having the highest repetition rate. A representation of the F1 signal in relation to the pulse input signals is shown in FIG. 4. The referenced timing and represented shapes of several pulses of the variable frequency oscillator are shown in FIG. 4 and will be explained later in the discussion of the operation of the variable frequency oscillator.

The sinusoidal output signal F1 is transmitted to a phase detector 42. The phase detector 42 is employed to compare the reference signal F1 from the bandpass circuit 36 to a feedback signal FO, directed from the output of the square wave voltage controlled oscillator VCO 34 through a feedback amplifier 44 to the phase detector 42. A representative timing of the feedback signal FO is also shown in FIG. 4. The reference frequency passed by the bandpass circuit 36, the output signal F1, interacts in the phase detector 42 with the square wave VCO output frequency in developing a corrective voltage output. This corrective voltage from the phase detector 42 is passed to and through a loop filter 46 as a corrective control voltage to the square wave VCO 34. is then A loop filter functions to stabilize the loop and to give the loop its proper transient response characteristics. Thus the controlling voltage for the square wave VCO 34 is directed from the phase detector 42 through the loop filter 46 to the square wave oscillator. The output of the square wave VCO 34 is the CLOCK signal which provides the timing and control of the data utilization device. To complete the loop and provide the phase lock, a portion of the output signal of the VCO is transmitted back to the phase detector 42 through the feedback amplifier 44.

The feedback amplifier 44 provides the necessary amplification for the signal tapped from the square wave VCO 34 and directed to and through the feedback amplifier 44 as the feedback signal FO. The feedback amplifier 44 also provides an isolation between the CLOCK signal and the feedback FO signal. The feedback amplifier 44 can be any type of amplifier circuit limited only by the frequency requirements in order to effect little or no change to the signal tapped from the square wave VCO.

The present invention provides a new and novel control system for phase locking a variable control square wave oscillator (VCO) by utilizing a bandpass circuit to change the incoming pulses to a sinusoidal signal having the same reference frequency as that of the incoming pulse. The bandpass circuit has a center frequency which is selected to be the same as the reference frequency for the phase detector. The bandpass circuit has a bandwidth that is selected to allow for any minor changes in the input frequency of the signal. The signal resulting from the bandpass circuit, the sinusoidal F1 signal, has the proper phase and frequency relationship such that the phase locked oscillator will be in sync with the pulse input signals. By converting the pulse input train to a sinusoidal signal F1, a gated type or a multiplier type of phase detector can be used.

Referring to FIG. 4, the representative timing of the pulse input signal, the sinusoidal F1 signal from the bandpass circuit 36, and the square wave pulses FO from the variable controlled square wave oscillator are shown. For the pulse train shown in FIG. 4, it can be shown by Fourier's analysis that for a pulse spacing K1A and a pulse width PW there exists a harmonic frequency of the sinusoidal signal F1 that is the same as the square wave signal FO, if the timing KA is chosen properly. The same is true for K2A, K3A, to KNA provided that K1, K2, K3 and KN are integers. The mathematical computation of the Fourier waveform analysis for a pulse train is given in the book, "Reference Data For Radio Engineers," Fourth Edition, International Telephone and Telegraph Corporation of New York, pages 1016–1024.

Accordingly, therefore, the present apparatus shown in FIG. 2 is used to phase lock a variable controlled square wave oscillator according to the frequency of the pulse input signals. The bandpass circuit permits only a desired integer harmonic of the pulse inputs to pass to a phase detector. The phase detector mixes the sinusoidal signals from the bandpass circuit to a feedback signal from the square wave oscillator to obtain a control signal which pulls the frequency of the variable controlled square wave oscillator to that of the reference frequency.

An example of the circuitry which can be used in the block diagram for the variable frequency oscillator 26 of FIG. 2 is shown in FIG. 3. It is to be understood that the circuitry shown in FIG. 3 is merely an example of a type of circuit which could be used in the block diagram of FIG. 2. The circuitry shown in FIG. 3 is divided into blocks in order to show direct comparison between FIG. 3 and the block diagram of FIG. 2.

The isolation amplifier 32 at the input of the variable frequency oscillator is a standard one transistor amplifier which provides a voltage gain to the pulse input from the pulse shaping circuit (see FIG. 1) while isolating the rest of the variable frequency oscillator and thereby preventing loading on the pulse input signal. The pulse input signal is applied to the base B of transistor Q1 via a diode D1 and a resistor R capacitor C1 combination. The transistor Q1 amplifies the signal and via its collector C transmits the amplified pulse input signal to the pulse shaping section 38 of the bandpass circuit 36. The transistor Q1 of the isolation amplifier 32 basically operates as a switch in that the transistor operates in full conduction on the positive portions of the input signal and is cut off or nonconducting on the negative portion of the pulse input.

The pulse shaping circuit 38 comprises a transistor Q2 biased in partial conduction via a resistor R6 attached to a positive voltage of +12 volts. The other end of the resistor R6 is attached to the base B of transistor Q2. The emitter E is directly tied to a ground potential. The collector C of transistor Q2 is connected to the center of a voltage divider network comprising resistors R7 and R8. The capacitive coupling of the pulse input signal via capacitor C2 from the isolation amplifier 32 to the pulse shaping circuit 38 of the bandpass circuit 36 provides for a differentiated waveform applied to the transistor Q2. The differentiated waveform is amplified by transistor Q2 and, via a capacitor C3, is applied to the tuned amplifier section 40 of the bandpass circuit 36.

The tuned amplifier 40 comprises a tuned circuit made up of a coil L1 and two capacitors C4 and C5. The tuned circuit is in the collector C circuit of the transistor Q3. The differentiated signals from the pulse shaping circuit 38 are applied to the base B of transistor Q3. The base B is biased in a conduction state via the voltage divider network comprising resistors R9 and R10 connected to a positive potential +12 and a negative potential −12. The tuned circuit permits the amplification, through transistor Q3, of only the waveforms of a certain set frequency. All other frequencies are degraded. The frequency that is amplified is determined by the time constant of the inductance L1 and the capacitors C4 and C5 according to well-known principles. For a complete description of tuned amplifiers and for other tuned amplifier circuits, reference is made to chapter 12, pages 400–442 of Electronic and Radio Engineering by F. E. Terman, Fourth Edition, McGraw-Hill Book Company, Inc., New York, 1955. The output of the tuned circuit amplifier 40, sinusoidal waveform F1, is transmitted to a primary of a transformer T1 in the phase detector circuit 42.

Referring now to the phase detector circuit 42 of FIG. 3, the transformer T1, along with diodes D2 and D3, form a rectifier circuit which converts the sinusoidal waveform F1 applied to the primary of transistor T1 into a dc control voltage. This dc control voltage is directed to the variable controlled oscillator 34 to control the frequency of the oscillator. The voltage level of the dc control voltage is also controlled by the feedback signal FO directed to the center tap of the secondary of transistor T1 from the feedback amplifier 44.

The dc control voltage is directed from the phase detector 42 to the loop filter 46. The dc control voltage controls the base B of a transistor Q4 of the loop filter via a resistor R18. Resistors R13, R15 and capacitor C9 and resistor R17 series circuit is connected between the dc control voltage input and ground potential to provide for filtering any high frequency signal component from the dc control voltage. The transistor Q4 provides isolation and amplification of the dc control voltage before directing the output signal from the loop filter 46 to the square wave VCO 34 via its collector C. The transistor Q4 controls the base potential of two transistors Q5 and Q6 of the square wave VCO 34 via resistors R19 and R20 respectively.

The voltage controlled oscillator VCO 34 includes transistors Q5 and Q6, along with associated resistors and capacitors, and comprises a free running multivibrator. The free running multivibrator provides a square wave output signal which varies in frequency according to the conduction of transistor Q4. The operation of a free running multivibrator is well known in the art and will not be discussed in detail here. However, for the purposes of this discussion the frequency of operation of the square wave voltage controlled oscillator is controlled by transistor Q4 by the dc control voltage applied to the base B of transistor Q4 from the phase detector circuit. As the conduction rate of transistor Q4 is changed, the bias on the base B of transistors Q5 and Q6 is changed. Since an approximate voltage of 0.7 volts is required from the base junction to the emitter junction of a transistor in order to place the transistor into conduction, increasing the base potential increases the voltage required on the emitter. This increased turn on voltage is at a different point on the exponential charging curve of capacitor C10 therefore the charging time of the capacitor changes. Changing the charging time of capacitor C1, via a change in the bias on the base B of the transistors Q5 and Q6, changes the period of time each transistor is in conduction. Thus, the frequency of the square wave voltage controlled oscillator can be controlled by the dc control voltage output from the phase detector. The square wave output signal, the CLOCK signal shown in FIG. 3, is taken from the collector C of transistor Q6. A portion of the CLOCK signal is directed to the feedback amplifier 44 comprising transistors Q7 and Q8 and associated resistors and capacitors.

The feedback amplifier 44 provides amplification of the CLOCK signal for use by the phase detector 42, as well as providing isolation between the CLOCK signal and the internal signals in the phase detector 42. The feedback amplifier 44 is a basic two-stage capacitive-coupled amplifier.

The operation of the circuit will now be discussed using the block diagram of FIG. 2, the circuit diagram of FIG. 3, and the waveforms of FIG. 4. The pulse input signals, see FIG. 4, are the pulses obtained from the disc 10 via the transducer 16 and shaped by the pulse processing circuit 20 and pulse shaping circuit 22. The pulse input signals can vary in repetition rate from K1A to K2A and K3A, with K3A having a period of three times K1A, and K2A having a period of twice that of K1A. The width of the pulse is a dimension determined by the pulse shaping circuit 22 (see FIG. 1). As stated previously, by Fourier's analysis, the frequency of sinusoidal waveform F1 can be determined knowing the pulse width PW and the highest repetition rate of K1A. This sinusoidal frequency F1 then passes through at the center frequency of the tuned circuit in the tuned amplifier section 40 of the bandpass circuit 36. The train of pulse input signals is transmitted to the isolation amplifier 32 where they are amplified. The amplifier pulse train then directed to the pulse shaping circuit 38 where they are differentiated, shaped and transmitted to the tuned amplifier 40.

The shaped waveform from the pulse shaping circuit 38 is passed through the tuned circuit in the tuned amplifier 40 to provide the sinusoidal output signal F1.

The sinusoidal signal F1 is transmitted to the phase detector 42 where it is compared to the frequency and phase of the square wave VCO output signal. The output of the square wave VCO 34 is continually sampling the incoming signal F1 via the feedback amplifier 44 and phase detector 42. The phase detector 42 mixes the signal FO to the sinusoidal signal F1 and, if different, provides the required change in voltage to the control transistor Q4 of the square wave VCO 34 to change the frequency of the free running multivibrator. Therefore, the frequency of oscillation of the square wave free running oscillator is controlled, that is, phase locked, to the train of pulse input signals directed to the variable frequency oscillator VFO.

While the principles of the invention have now been made clear in an illustrative embodiment, there will be immediately obvious to those skilled in the art many modifications of structure, arrangement, proportions, the elements, material and components, used in the practice of the invention and otherwise which are particularly adapted for specific environments and operating requirements without departing from those principles.

For instance, the discrete components used for the variable frequency oscillator VFO as shown in FIG. 3 could of course be integrated circuit components as well as different types of transistors and different wiring of the other components such as resistors and capacitors depending possibly upon the potential applied to the circuit. There are many different types of circuitry which could be easily substituted in the block diagram of the variable frequency oscillator shown in FIG. 2. These circuits can be obtained by reference to the aforementioned book "Reference Data for Radio Engineers." As an example, a complete discussion of the steps necessary for the design of a phase detector circuit is discussed on pages 58 through 61 of the book using the equations set out as equation 5–6 through equation 5–18. Also the application of the variable frequency oscillator to a disc system is again only representative of one embodiment which can use the bandpass filtering in the variable frequency oscillator as disclosed. Many other uses will come to mind to those skilled in the art such as the obtaining of a controlled clock timing from a magnetic tape drive system. The appended claims are, therefore, intended to cover and embrace any such modification within the limits only of the true spirit and scope of the invention.

What I claim is:

1. A phase locked oscillator system comprising:

an oscillator including frequency controlling means for controlling the frequency of an output signal from said oscillator;

a phase detector responsive to the output signal from said oscillator and to a sinusoidal reference signal for providing a control signal functionally related to the phase difference between the oscillator output signal and the sinusoidal reference signal;

a bandpass circuit responsive to an input pulse signal repetition rate and integer multiples thereof for providing the sinusoidal reference signal equal in frequency to the highest integer multiple of the input pulse signal repetition rate to said phase detector, wherein said phase detector provides the control signal to said frequency controlling means to lock the frequency of the output signal generated by said oscillator to the sinusoidal reference signal frequency.

2. A phase locked oscillator system according to claim 1 wherein said oscillator generates square wave output pulse signals.

3. The phase locked oscillator system according to claim 1 wherein said bandpass circuit further includes a pulse shaper to reshape the input pulse signals to a uniform pulse width.

4. The phase locked oscillator system according to claim 3 wherein said pulse shaper comprises a one-shot multivibrator.

5. The phase locked oscillator system according to claim 4 wherein said bandpass circuit comprises a resonant tuned circuit having a resonant frequency equal to the highest integer multiple of the repetition rate of the input pulse signals as shaped by the pulse shaper.

6. The phase locked oscillator system according to claim 4 wherein the bandpass circuit comprises a narrow-band tuned amplifier having a resonant frequency equal to the highest integer multiple of the repetition rate of the input pulse signals as shaped by the pulse shaper.

7. In a phase locked oscillator system including a variable frequency oscillator having frequency controlling means, and a phase detector responsive to an output signal from said variable frequency oscillator and to a sinusoidal reference signal for providing a control signal functionally related to the phase difference between the output signal and the sinusoidal reference signal, said control signal controlling said frequency controlling means, wherein the improvement comprises; a bandpass circuit responsive to an input pulse signal repetition rate and integer multiples thereof, for providing the sinusoidal reference signal equal in frequency to the highest integer multiple of the input pulse signal repetition rate to the phase detector, wherein said phase detector provides the control signal to said frequency controlling means to lock the frequency of the output signal generated by the oscillator to the sinusoidal reference signal frequency.

8. The phase locked oscillator system according to claim 7 wherein said bandpass circuit further includes a pulse shaper to reshape the input pulse signals to a uniform pulse width.

9. The phase locked oscillator system according to claim 8 wherein said pulse shaper comprises a one-shot multivibrator.

10. The phase locked oscillator system according to claim 9 wherein said bandpass circuit comprises a resonant tuned circuit having a resonant frequency equal to the highest integer multiple of the repetition rate of the input pulse signals as shaped by the pulse shaper.

11. The phase locked oscillator system according to claim 9 wherein the bandpass circuit comprises a narrow-band tuned amplifier having a resonant frequency equal to the highest integer multiple of the repetition rate of the input pulse signals as shaped by the pulse shaper.

* * * * *